US010288330B2

(12) United States Patent
Schon

(10) Patent No.: US 10,288,330 B2
(45) Date of Patent: May 14, 2019

(54) MICROCHANNEL EVAPORATORS WITH REDUCED PRESSURE DROP

(71) Applicant: Steven Schon, Strafford, PA (US)

(72) Inventor: Steven Schon, Strafford, PA (US)

(73) Assignee: QCIP Holdings, LLC, Strafford, PA (US)

(*) Notice: Subject to any disclaimer, the term of this patent is extended or adjusted under 35 U.S.C. 154(b) by 0 days.

(21) Appl. No.: 15/402,499

(22) Filed: Jan. 10, 2017

(65) Prior Publication Data

US 2017/0299239 A1 Oct. 19, 2017

Related U.S. Application Data

(60) Provisional application No. 62/324,320, filed on Apr. 18, 2016.

(51) Int. Cl.
*F25B 39/00* (2006.01)
*F28F 9/02* (2006.01)
(Continued)

(52) U.S. Cl.
CPC .............. *F25B 39/00* (2013.01); *F25B 39/02* (2013.01); *F28F 3/086* (2013.01); *F28F 9/026* (2013.01); *F28F 9/028* (2013.01); *F28F 9/0224* (2013.01); *H01L 23/427* (2013.01); *F25B 39/022* (2013.01); *F25B 39/028* (2013.01); *F25B 2500/26* (2013.01); *F28D 2021/0029* (2013.01); *F28F 2210/02* (2013.01); *F28F 2260/02* (2013.01)

(58) Field of Classification Search
CPC ........ F25B 39/00; F25B 39/02; F25B 39/022; F25B 39/028; F25B 2500/26; F28F 9/028; F28F 3/086; F28F 9/026; F28F 9/0224; F28F 2210/02; F28F 2260/02; F28D 2021/0029

See application file for complete search history.

(56) References Cited

U.S. PATENT DOCUMENTS

| 2007/0084585 A1 | 4/2007 | Takagai et al. |
| 2007/0217147 A1* | 9/2007 | Chang .................. H01L 23/473 361/689 |

(Continued)

FOREIGN PATENT DOCUMENTS

WO 2012054455 4/2007

OTHER PUBLICATIONS

International Search Report and Written Opinion, PCT/US 2017/028179, dated Aug. 24, 2017.

*Primary Examiner* — Emmanuel Duke
(74) *Attorney, Agent, or Firm* — Kristofer E. Elbing

(57) ABSTRACT

In one general aspect, a converging split-flow microchannel evaporator is disclosed. It includes a conductive contact surface to mate to a surface to be cooled, with a core mounted in thermal connection with the conductive surface that defines at least one layer of microchannels. Within the core, one inlet restriction restricts the flow into each microchannel in a first group of the microchannels, and another restricts the flow into each microchannel in a second group. A centrally located fluid outlet receives the flows from opposite ends of the microchannels in the two groups. A check valve can be provided to help ensure ready startup without reverse flow.

21 Claims, 16 Drawing Sheets

(51) Int. Cl.
*F28F 3/08* (2006.01)
*H01L 23/427* (2006.01)
*F25B 39/02* (2006.01)
*F28D 21/00* (2006.01)

(56) References Cited

U.S. PATENT DOCUMENTS

2011/0030420 A1\* 2/2011 Kirkwood ............... F25B 39/00
 62/498
2011/0056667 A1\* 3/2011 Taras .................... F28D 1/0426
 165/173

\* cited by examiner

MICROCHANNEL EVAPORATORS WITH REDUCED PRESSURE DROP

CROSS-REFERENCE TO RELATED APPLICATION

This application claims the benefit under 35 U.S.C. 119(e) of U.S. provisional application Ser. No. 62/324,320, filed Apr. 18, 2016, which is herein incorporated by reference.

FIELD OF THE INVENTION

This invention relates to microchannel-based heat exchangers, including microchannel-based evaporators used to cool heat sources with high heat fluxes such as electronic devices.

BACKGROUND OF THE INVENTION

Fluid heat exchangers are used to remove waste heat from high-heat flux heat sources (typically in excess of 5 watts/cm$^2$, and often substantially higher) by accepting and dissipating thermal energy therefrom. Examples of such high-heat flux heat sources include microelectronics, such as microprocessors and memory devices, solid-state light emitting diodes (LEDs) and lasers, insulated-gate bipolar transistor (IGBT) devices, such as power supplies, photovoltaic cells, radioactive thermal generators and fuel rods, and internal combustion engines.

The fluid heat exchangers dissipate heat by thermally conducting the heat into internal passages of the exchanger, through which a coolant fluid flows, absorbing the heat conducted across the walls of the exchanger, and then transporting the fluid outside the exchanger, where the heat is rejected to an external heat sink. While the coolant fluid flowing through the exchanger may be a gas, it is generally preferable to use a liquid, as liquids have higher heat capacities and heat transfer coefficients than gases. The liquid may remain in a single phase, or the liquid may partially or completely evaporate within the internal passages of the exchanger.

The flow of coolant liquid fed to the fluid heat exchanger may be driven by a pump, or by natural convection due to density differences and/or elevation between the incoming and exiting fluid (e.g. thermosyphons), or by capillary action in the internal passages of the exchanger, or by a combination of these mechanisms.

Evaporator-type exchangers rely on the boiling mode, and have the advantages of higher heat transfer coefficients (better heat transfer) per unit of fluid flow rate of the coolant fluid. They also require much less coolant flow, as the majority of the heat is absorbed through via the latent heat of vaporization of the boiling fluid, rather than the sensible heat (heat capacity) of a single-phase liquid or gas.

It is well known that the thermal performance and efficiency of fluid heat exchangers can be greatly enhanced if the internal passages are comprised of microchannels, i.e. channels having cross-sections with a smallest dimension of less than 1000 microns, and more typically, in the range of 50-500 microns. However, as a consequence of the microchannel dimensions, the hydraulic diameters (D_h) of such passages are quite small and restrictive, resulting in high pressure drops (D_h=4×cross sectional area divided by the cross-sectional perimeter length). These high pressure drops tend to require more pumping power for pumped systems, and reduce the coolant flow rate for systems where the flow is driven by natural convection and/or capillary action. For pumped systems, this generally results in higher energy consumption (additional parasitic energy losses), while for natural-convection or capillary-driven systems, the reduced flows can result in reduced heat removal capacity or even dry-out of the fluid exchanger.

One way to reduce the pressure drop in the microchannel heat exchangers is to divide the flow path into shorter segments, i.e. splitting the flows, with the split segments being supplied from a common central inlet. This approach has been used in fluid heat exchangers configured to provide a split flow of a single-phase liquid in pumped systems.

SUMMARY OF THE INVENTION

In one general aspect, the invention features a converging split-flow microchannel evaporator. It includes a conductive contact surface to mate to a surface to be cooled, with a core mounted in thermal connection with the conductive surface that defines at least one layer of microchannels. Within the core, one inlet restriction restricts the flow into each microchannel in a first group of the microchannels, and another restricts the flow into each microchannel in a second group. A centrally located fluid outlet receives the flows from opposite ends of the microchannels in the two groups.

In another general aspect, the invention features a converging split-flow microchannel evaporator that includes a thermally conductive contact surface to mate to a surface to be cooled and a core mounted in thermal connection with the contact surface and defining at least one layer of microchannels each spanning between a first end and a second end. A first fluid inlet is hydraulically connected to the first end of a first plurality of the microchannels, and inlet restrictions each restrict the flow into one of them. A second fluid inlet is hydraulically connected to the first end of a second plurality of the microchannels, and inlet restrictions each restrict the flow into one them. A fluid outlet is located between the first fluid inlet and the second fluid inlet, and is hydraulically connected to the second ends of the microchannels in both pluralities.

In preferred embodiments, the first plurality of microchannels can be oriented in parallel between the first fluid inlet and the fluid outlet, with the second plurality of microchannels being oriented in parallel between the second fluid inlet and the fluid outlet. The apparatus can further include a third fluid inlet hydraulically connected to the first end of a third plurality of microchannels defined in the core, a third plurality of inlet restrictions at the third fluid inlet that each restrict the flow into one of the third plurality of microchannels defined in the core, a fourth plurality of inlet restrictions that each restrict the flow into one of a fourth plurality of microchannels defined in the core, and a second fluid outlet located between the third fluid inlet and the second fluid inlet, wherein the fluid outlet is hydraulically connected to the second ends of the microchannels in the third plurality of microchannels defined in the core, and hydraulically connected to the second ends of the microchannels in the fourth plurality of microchannels defined in the core. The second fluid inlet can be hydraulically connected to the first end of the third and fourth pluralities of microchannels defined in the core. The microchannels can be organized in a radially converging pattern around the fluid outlet. The core can define multiple layers of microchannels at different distances from the thermally conductive contact surface. At least some of the microchannels can have different cross-sections. The microchannels defined by the core can each have a hydraulic diameter of less than 1000 microns. The first and second inlet restrictions can be defined by a cross-sectional area of restriction that is no more than about three-quarter the cross sectional area of the largest section of the remainder of the length of the microchannels, with the length of the flow restriction being less than 20% of the remainder of the length of the microchannels. The hydraulic diameter of the microchannels can be less than 500 microns. The core can include a laminate structure that defines the microchannels. The apparatus can further include a check valve upstream of the first and second inlets to help ensure ready startup without reverse flow. The check valve can include a Tesla diode. The first and second inlet restrictors can include check valves. The thermally conductive contact surface can be part of a base plate, with the core being mounted on the base plate opposite the thermally conductive contact surface.

In a further general aspect, the invention features a method of evaporatively cooling a surface that includes contacting the surface with a heat exchanger and causing a liquid coolant to flow separately into at least two different flows in the heat exchanger. A first of the flows is conveyed into a first plurality of separate microchannels in the heat exchanger, and a second of the flows is conveyed into a second plurality of separate microchannels in the heat exchanger. These flows into the microchannels are both restricted. At least some of the liquid coolant is evaporated in the first and second pluralities of microchannels, and the flows are reunited after the step of evaporating.

In preferred embodiments, the step of causing a coolant to flow can be completely passive. The step of causing a coolant to flow can include a step of wicking. The step of causing a coolant to flow can be part of a thermosiphon process. The step of causing a coolant to flow can include a step of pumping. The step of causing a coolant to flow can cause a refrigerant to flow. The step of causing a coolant to flow can cause a dielectric fluid to flow.

In a yet another general aspect, the invention features a converging split-flow microchannel evaporator that includes means for causing a liquid coolant to flow separately into at least two different flows. The evaporator also includes means for conveying a first of the different flows of the liquid coolant into a first plurality of separate microchannels in the evaporator and means for restricting the first flow of the liquid coolant into each of the first plurality of separate microchannels, as well as means for conveying a second of the different flows of the liquid coolant into a second plurality of separate microchannels, and means for restricting the second flow of the liquid coolant into each of the second plurality of separate microchannels in the evaporator. The evaporator further includes means for reuniting the flows that are responsive to the first and second microchannels.

In yet a further general aspect, the invention features a microchannel heat exchanger that includes a cover, a base, and thermally conductive sheets between the cover and the base that each define a series of side-by-side lanes aligned with a flow direction. The lanes each include aligned slots that define microchannel segments and are separated by cross ribs. The sheets are stacked between the base and cover so as to cause at least some of the ribs to be offset from each other and allow the microchannel segments in the same lane in adjacent sheets to communicate with each other along the flow direction to define a plurality of microchannels in the heat exchanger.

In preferred embodiments, the thermally conductive sheets can further define access channel openings at each end of the lanes, which when stacked create access channels for the microchannels. The sheets can define a more dense packing of cross ribs in at least one inlet end of the heat exchanger to reduce the open cross-section at the inlet end of the lanes. The aspect ratio of the microchannels can be above 4:1. The aspect ratio of the microchannels can be above 8:1. The apparatus can further include thermally conductive separator sheets located between groups of the thermally conductive sheets to form a multilayer heat exchanger. The sheets can be made of at least one conductive metal. The sheets can be made of sinterable thermally conductive ceramics. The sheets can be bonded or fused. The microchannels can have a hydraulic diameter of below 500 microns. The microchannels can have a hydraulic diameter of below 200 microns. The base can be a base plate that is thicker than each of the sheets and the cover can include access channels in communication with the microchannels. The base can be thermally conductive yet electrically insulating. The heat exchanger can be constructed for boiling or evaporating fluid service, with the heat exchanger further including flow restrictors at the inlet ends of the microchannels. The flow restrictors can be defined by a perforated sheet placed across the inlet end of the microchannels. The flow restrictors can be defined by a porous sheet placed across the inlet ends of the microchannels. The flow restrictors can be formed by alternately closing an end of the first slot in a lane of slots with cross-ribs that are wider than the bulk of the cross-ribs between slots, with the alternating closed-ended lanes of slots being staggered with respect to the lanes of slots above or below, in alternating layers of slotted sheets, such that, when the sheets are stacked and bonded together, the cross-section of the parallel channels that are formed have a checkerboard pattern across the inlets of the plurality of channels, which serve as integral flow restrictors covering substantially 50% of a cross-sectional area of the main channels. The flow restrictors can be provided by a comb-like arrangement of strips across the inlets of the microchannels, with teeth of the comb-like strip being narrow strips, and with gaps defined between the teeth being aligned with and narrower than an open cross-sectional area of the microchannels.

Systems according to the invention can help to suppress Ledinegg effects and thereby allow split-flow exchangers to work with two-phase systems. By providing inlet restrictions around a centrally located fluid outlet, microchannel evaporators according to the invention can avoid flow instabilities, due to the Ledinegg effect, whereby boiling within multiple (parallel) microchannels might otherwise be non-uniform and due to the interaction of varying pressure drop as boiling develops in the various channels, resulting in periodic backflow into the inlet header or manifold. This can help to achieve stabilized and substantially uniform boiling flows and thereby result in improved and more stable thermal performance when cooling high-flux heat sources.

DETAILED DESCRIPTION OF AN ILLUSTRATIVE EMBODIMENT

Figure 1:
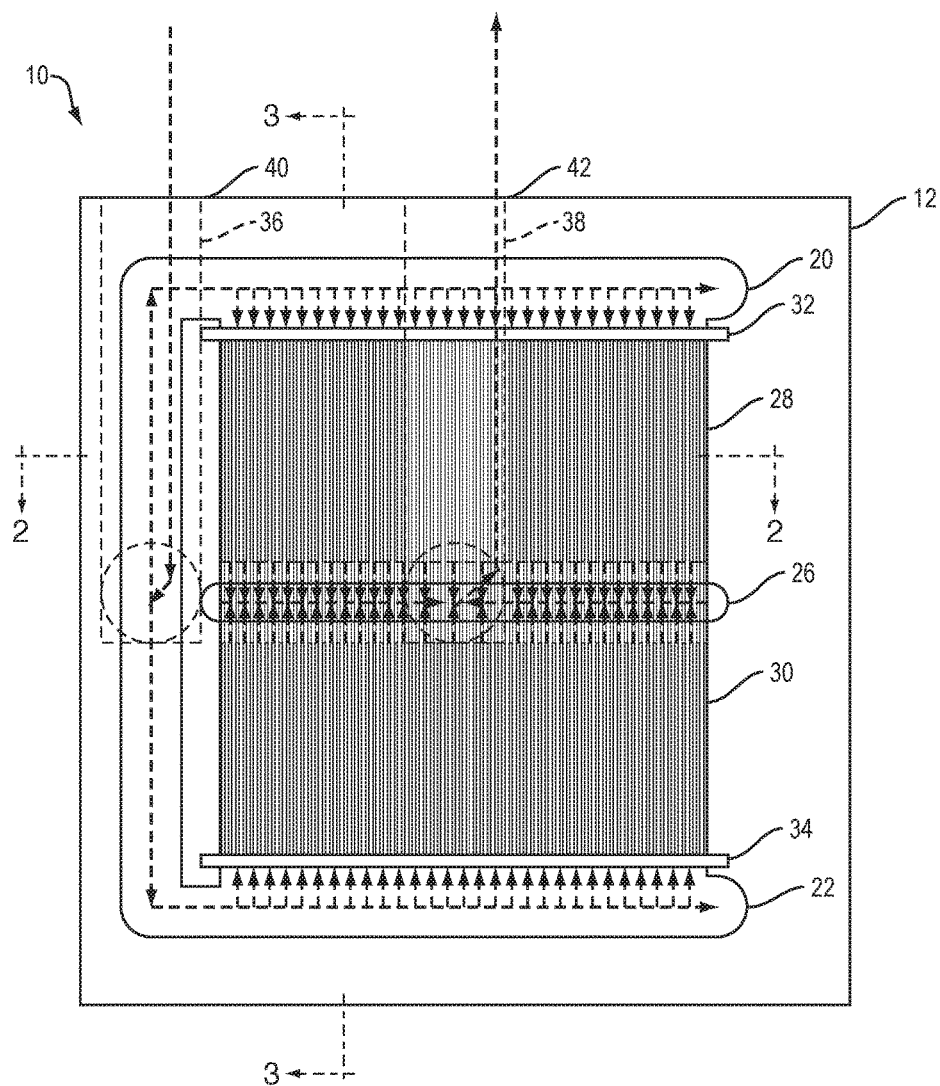
FIG. 1 is a top-view cross-section of a converging split-flow microchannel evaporator according to the invention showing its inlet and outlet ports in phantom.
Figure 2:
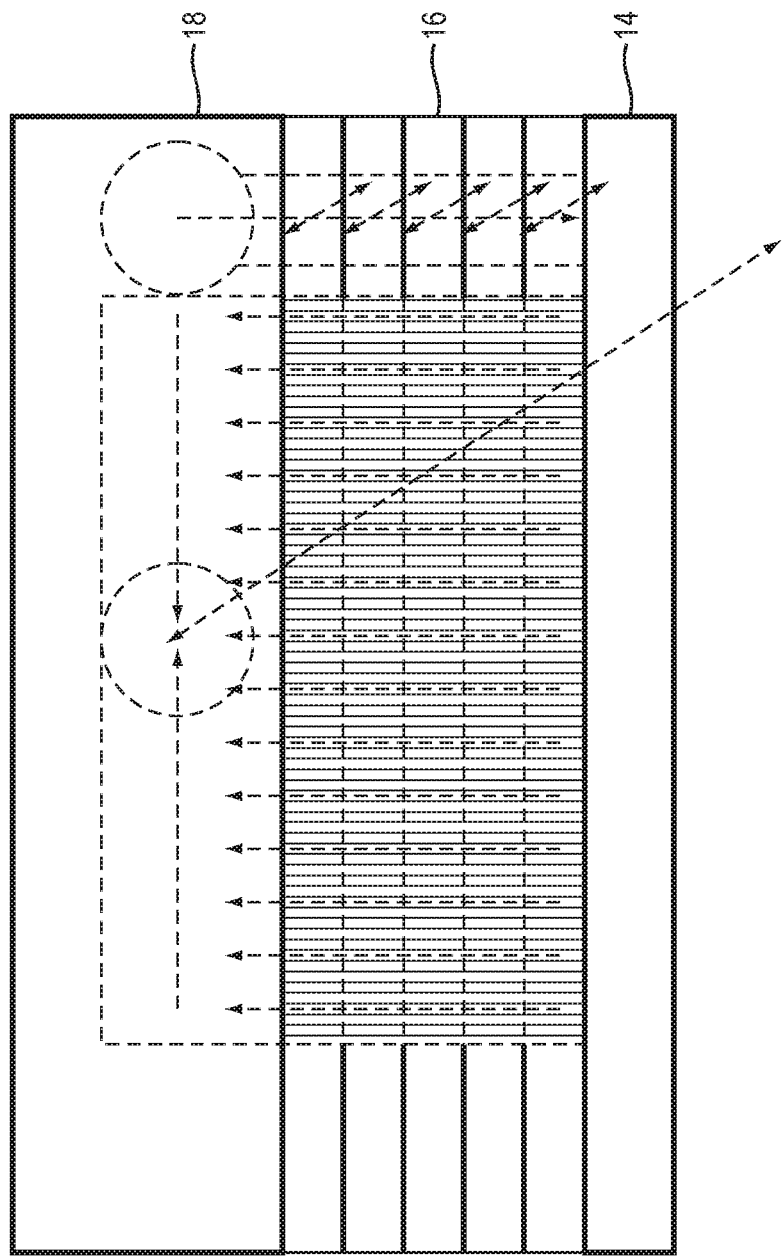
FIG. 2 is a cross section of the converging split-flow microchannel evaporator of FIG. 1 shown facing in a direction specified by lines 2-2 in FIG. 1.
Figure 3:
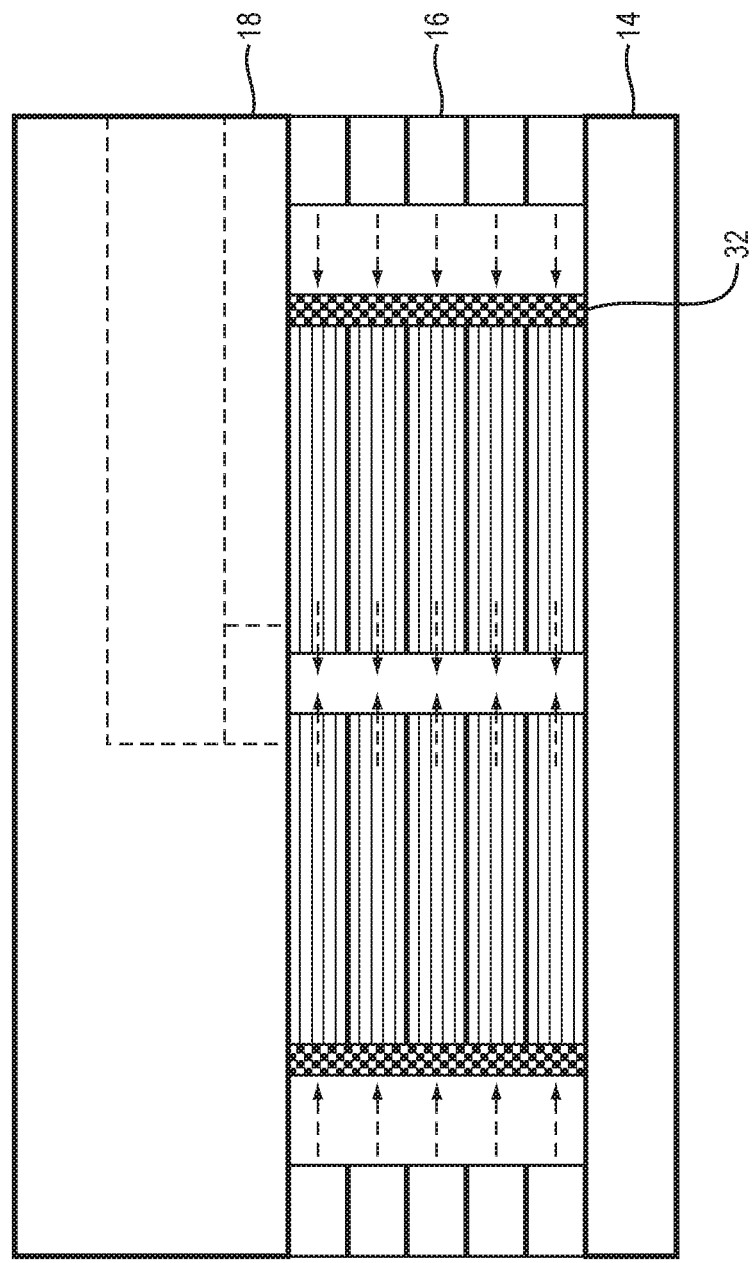
FIG. 3 is a cross-section of the converging split-flow microchannel evaporator of FIG. 1 shown facing in a direction specified by lines 3-3 in FIG. 1.

Referring to FIGS. 1-3, a converging split-flow microchannel evaporator 10 according to the invention includes a body 12 that is made up of a contact plate 14, a core 16, and a cover 18. In the orientation shown, the contact plate is on the bottom and the cover is on the top allowing the evaporator to cool a planar horizontal surface, but the evaporator can be used on surfaces that are oriented in other planes, or the evaporator may have non-planar or curved contact surfaces, corresponding to the surfaces of non-planar heat-generating devices. And while the contact plate, core, and cover are shown as separate parts, they can be combined or broken into further subparts.

The core 16 includes a first inlet manifold 20 that runs along one edge of the core, a second inlet manifold 22 that runs along an opposite edge of the core, and an outlet manifold 26 that runs along the centerline of the core, between, and parallel to, the two inlet manifolds. A first set of microchannels 28 spans from the first inlet manifold to the outlet manifold, and a second set of microchannels 30 spans from the second inlet manifold to the outlet manifold. Each set of microchannels includes one or more layers that each include a number of side-by-side microchannels that span from one of the input manifolds to the output manifold. The microchannels are preferably manufactured as layers of parallel conduits of uniform hydraulic diameter disposed in a stack of parallel planar layers, although in some applications deviations from this geometry might be appropriate. The inlet manifolds can be of any suitable shape such that they communicate with the inlets of the paired microchannels. Cores having 2, 3, or 4 layers of 64, 79, or 125 microchannels per layer are contemplated as workable examples for cooling microelectronic devices, but many other configurations are possible.

A first set of inlet restrictors 32 is placed between the first inlet manifold 20 and the first set of microchannels 28, such that each microchannel is coupled with a corresponding flow restrictor. Similarly, a second set of inlet restrictors 34 is placed between the second inlet manifold 22 and the second set of microchannels 30, such that each microchannel is coupled with a corresponding flow restrictor. These flow restrictors are preferably manufactured as part of a laminated core structure described in more detail below.

An inlet conduit network 36 conveys fluid received at an input port 40 on the evaporator body 12 to the input manifolds 20, 22. An outlet conduit network 38 conveys fluid received from the output manifold 26 to an output port 42 on the evaporator body. The conduits in the input and output conduit networks can each be oriented in any appropriate direction.

The overall structure of the evaporator can be configured in a variety of ways. The outlet manifold does not need to be exactly centered between the inlet manifolds, for example. The inlet and/or outlet manifolds also do not need to be built in a straight line.

In operation, the base plate of the microchannel evaporator 10 is in conductive thermal contact with a heat generating portion of a heat generating component. A flow of vaporizable coolant is introduced to the heat exchanger such that the fluid flows via the inlet manifolds into a number of paired sub-flows, with each pair flowing toward each other, with all the sub-flows converging from the opposite fluid outlets of the sets of microchannels into the nominally centralized outlet manifold or cavity. The coolant absorbs the heat conducted across the microchannel walls and partially vaporizes. The resulting two-phase fluid mixture is transported outside the evaporator, where the heat is rejected to an external heat sink. The vapor portion is condensed and recombined with the un-evaporated fluid, and the combined liquid is returned to the inlet of the exchanger.

In another embodiment, a vaporizable liquid coolant is introduced to the converging split-flow microchannel evaporator via one or more feed ports connected to one or more internal manifolds within the evaporator. The fluid flows across the restricted openings into the plurality of paired microchannels, and by means of thermal conduction from the base plate and the microchannel walls, absorbs heat from the heat-generating component that is in thermal contact with the base plate of the evaporator. The absorbed heat causes the fluid to reach its saturation temperature and then boil as it traverses the microchannels. The supply pressure of the fluid is sufficiently high to ensure adequate flow such that at least some of the fluid remains liquid (i.e. not totally evaporated) by the time it reaches the outlet ends of the plurality of microchannels. The two-phase (liquid and vapor) fluid exiting the plurality of microchannels converge in the centralized outlet manifold or cavity within the evaporator, which is connected to one or more outlet ports emerging from the evaporator. The two-phase flow exiting the evaporator flows to an external condenser, where the coolant vapor is producing an all-liquid coolant, which is then returned to the inlet of the evaporator.

In another embodiment, the liquid circulation is driven by thermosyphon action, wherein the liquid level (coming off the condenser) is at a suitable elevation above the evaporator, and the difference in between inlet liquid head (accounting for liquid density and elevation) and lower-density two-phase fluid outlet provides sufficient pressure to overcome the pressure drop across the evaporator, condenser, and connecting piping.

The liquid circulation can also be driven by low-head pump. It can be driven by capillary action, as well, using a wick structure in the liquid return line from the condenser.

In another embodiment, the inlet restrictions have a cross-sectional area of 10% to 50% of the cross sectional area of the largest section of the remainder of the length of the microchannels, and the length of the inlet restrictions is between 1% and 10% of the length of the microchannels.

In another embodiment, one or more layers of microchannels are formed by fabricating grooves into sheets that comprise the one or more layers, and the inlet restrictions are provided by a narrower section of the grooves corresponding to the channel inlets.

In another embodiment, one or more layers of microchannels are formed by sheets provided with slots. The inlet restrictions are provided by a narrower section of each slot, corresponding to the channel inlets. A microchannel layer is defined by placing sheets or shims between stacks of slotted sheets, where the sheets have only a single long slot, transverse to and centered on the overall length of the slotted sections of the sheets below, said transverse slot providing the common exit point for the conversing flows of each pair of channels in a layer.

In another embodiment, the microchannel evaporator uses one or more layers of microchannels, and the inlet restrictions are provided by perforated transverse strips across the inlets of the plurality of microchannels, with the perforations being aligned with the open cross-sectional area of each microchannel.

In another embodiment, the microchannel evaporator uses one or more layers of microchannels, and the inlet restrictions are provided by porous transverse strips across the inlets of the plurality of microchannels, with the perforations being aligned with the open cross-sectional area of each microchannel.

In another embodiment, the microchannel evaporator uses one or more layers of microchannels, and the inlet restrictions are provided by comb-like arrangement of strips across the inlets of the plurality of microchannels, wherein the "teeth" of the comb-like strip are narrow vertical or horizontal strips, whose gaps between the teeth are aligned with and are narrower than open cross-sectional area of each microchannel.

In another embodiment discussed below in more detail, the one or more layers microchannels are fabricated from bonded stacks of slotted sheets, with short cross-ribs between sheets, and the alternating sheets have staggered placement of the cross-ribs. A microchannel layer is defined by placing sheets or shims between stacks of slotted sheets, where the sheets have only a single long slot, transverse to and centered on the overall length of the slotted sections of the sheets below, said transverse slot providing the common exit point for the conversing flows of each pair of channels in a layer.

When the sheets are stacked and bonded together, the (common) walls between the slots on each sheet form the walls of the microchannels. The aspect ratio of the channels is controlled by the number of sheets stacked together to make a layer of microchannels. Because of the staggered cross-ribs that traverse the channels that are formed, the flow across the channels is serpentine or dolphin-like since the fluid will flow both over and under the cross ribs that intersperse the channels. The cross-ribs thereby enhance the heat transfer, both through increased heat transfer coefficient due to the micro-turbulence and flow splitting/recombining they induce, and by providing additional heat conduction and boiling surface area.

The microchannel inlet restrictions are formed by closing the ends of the first and last slot in alternating lines of slots, with cross-ribs that are wider than the bulk of the cross-ribs between slots. The alternating closed-ended lines of slots are staggered with respect to the lines of slots above or below, in alternating layers of slotted sheets. When the sheets are stacked and bonded together, the cross-section of the parallel channels that are formed have a checkerboard pattern at the ends, which serve as the channel inlets with integral flow restrictors covering substantially 50% of the cross-sectional area of the main channels.

The aspect ratio of the channels is controlled by the number of sheets stacked together to make a layer of microchannels. This overcomes the limitations on high aspect ratios imposed by various techniques, such as photochemical machining or laser micromachining, for making grooved or through-cut/slotted structures. These techniques can be use to fabricate thin sheets with narrow walls between slots (thereby increasing the number of microchannels per unit width) but with low aspect ratios; by stacking and bonding the sheets, the desired (higher) channel aspect ratios can be achieved. The cross-ribs provide mechanical strength, preventing deformation of the channel cross-sections when the sheets are bonded together.

In another embodiment, the microchannel evaporator uses a one or more layers of microchannels, and the inlet restrictions are provided by transverse strips or fins across the inlets of each layer of microchannels, wherein the strips or fins are a fraction of the height of the channels, thereby partially blocking the inlets.

In another embodiment discussed below in more detail, the microchannels in the thermally "active" area above the base plate are arranged parallel to each other, and the nominal overall microchannel length across the base plate is divided into two or more sub-sets of converging split flows, using multiple narrow inlet and outlet manifold between successive pairs of converging microchannels. (This further reduces average microchannel length and the pressure drop between the inlet and outlet of the evaporator—see FIGS. 14-15).

In another embodiment discussed below in more detail, the microchannels in the thermally "active" area above the base plate are arranged in pairs substantially radially around the central outlet manifold or cavity. The inlet manifold is concentric, on the periphery of the microchannels (see FIG. 16).

In another embodiment, cross section of the inlet and outlet manifold is greater than the sum of the cross sections of the plurality of the microchannels. The evaporable coolant can be a dielectric fluid. The evaporable coolant can also be a refrigerant.

In another embodiment, the various components of the microchannel evaporator are bonded or fused, so that the evaporator is hermetically sealed (with the exception of the fluid inlet and outlet ports that communicate with the manifolds), so that the evaporator can hold elevated internal pressures. Bonding or fusing means may include, but are not limited to, diffusion bonding, brazing, soldering, welding, sintering, and the like.

In another embodiment, the various components of the microchannel evaporator are held together mechanically, with suitable seals between components, so that the evaporator can hold elevated internal pressures. This mechanical assembly can be provided by structures that can include, but are not limited to, bolts, studs, clamps, adhesives, and the like. Seals may include but are not limited to gaskets, O-rings, caulks, and the like.

In another embodiment, the bottom base of the layer of the microchannel evaporator is made from or is coated with a thermally conductive but electrically insulating ceramic or dielectric solid, such as aluminum nitride, silicon carbide, beryllium oxide, diamond film, and the like. The microchannel evaporator then serves as the substrate for (heat generating) electronic components, which are mounted on and in thermal contact with the ceramic underside surface of the evaporator.

Laminate Core Structure

Figure 4:
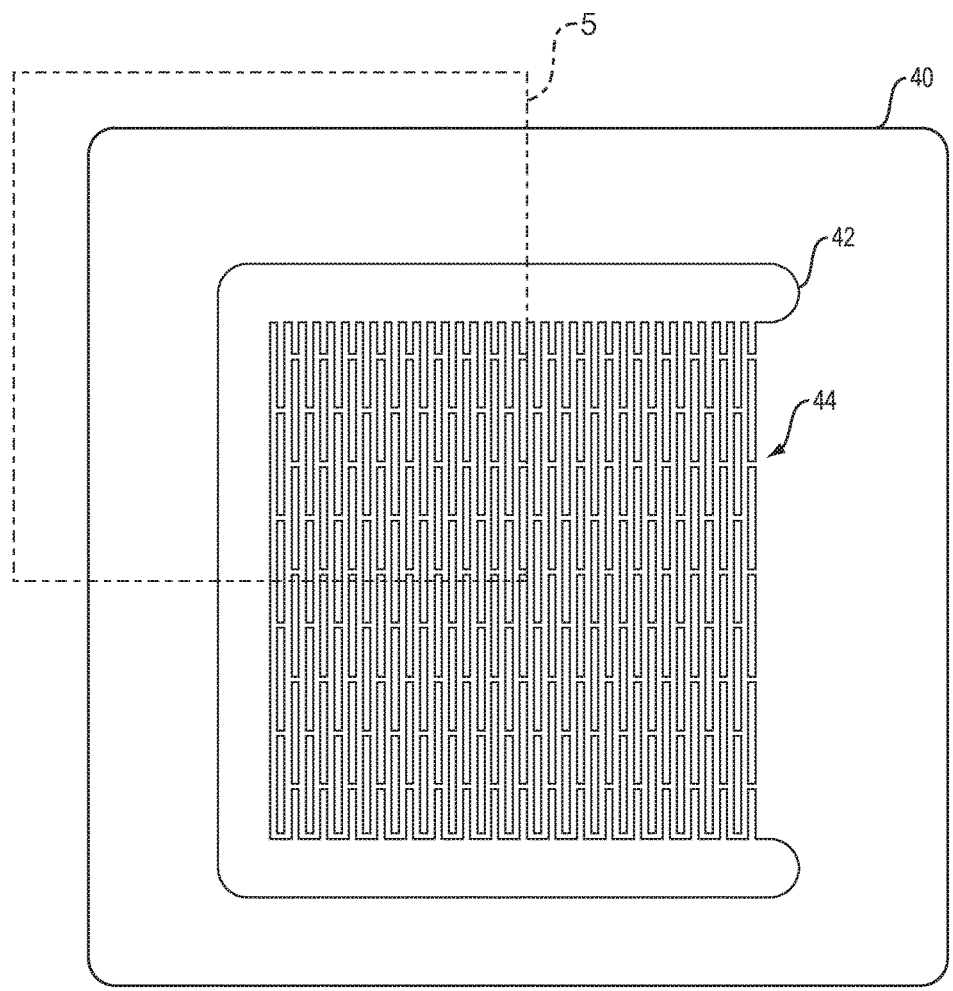
FIG. 4 is a plan view of a first type of grooved sheet for inclusion in a grooved laminate structure that can be used to implement the converging split-flow microchannel evaporator of FIG. 1.

As noted above, converging split-flow microchannel evaporators such as the one shown in FIG. 1 can be assembled using a grooved laminated structure made up of a plurality of thermally conductive sheets. One such sheet of a first type 40 is shown in FIG. 4. It includes common cut-out areas 42 that are separated lines 44 of slots 46 that define the microchannels.

More specifically, the sheet of the first type 40 includes a plurality of lines 44 of multiple slots 46, with the slots in a given line being separated by thin wall that functions as a cross-rib 48. These lines span between the common cut-out areas connected to the slots at either end of each line of slots. The common cut-out areas align with each other to form input conduits and input manifolds when sheets are stacked.

Figure 6:
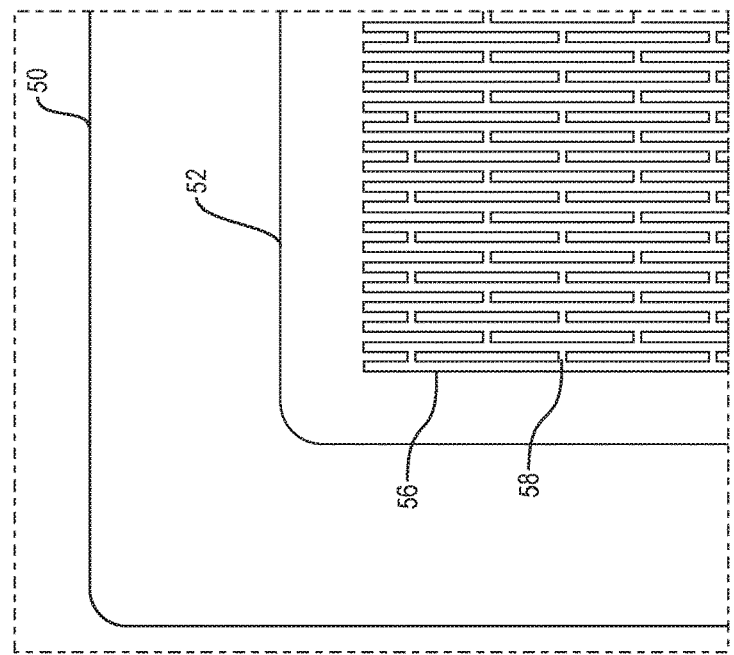
FIG. 6 is a plan view of a portion of a second type of grooved sheet for inclusion in the grooved laminate structure.
Figure 5:
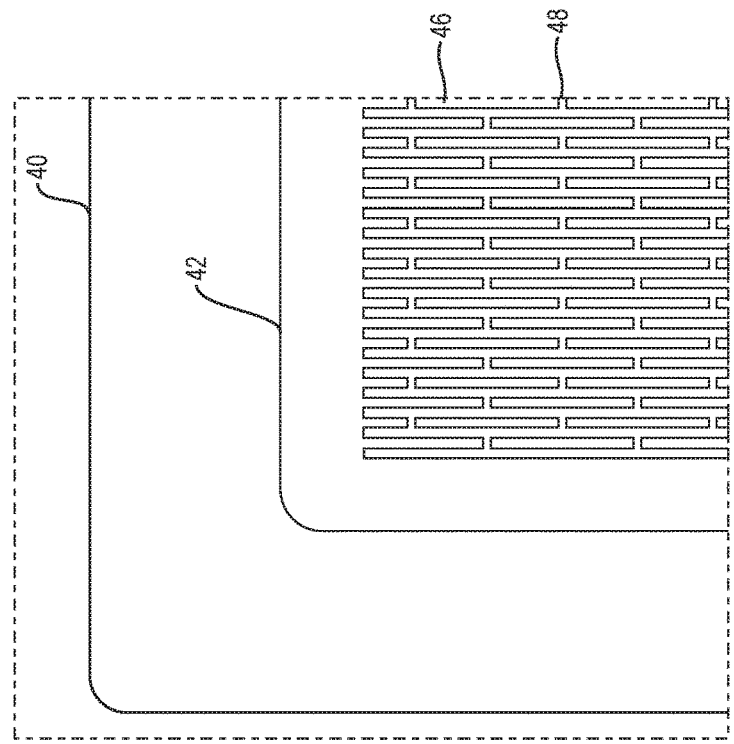
FIG. 5 is a plan view of a portion of the first type of grooved sheet of FIG. 4 shown in rectangle 5 on FIG. 4.
Figure 8:
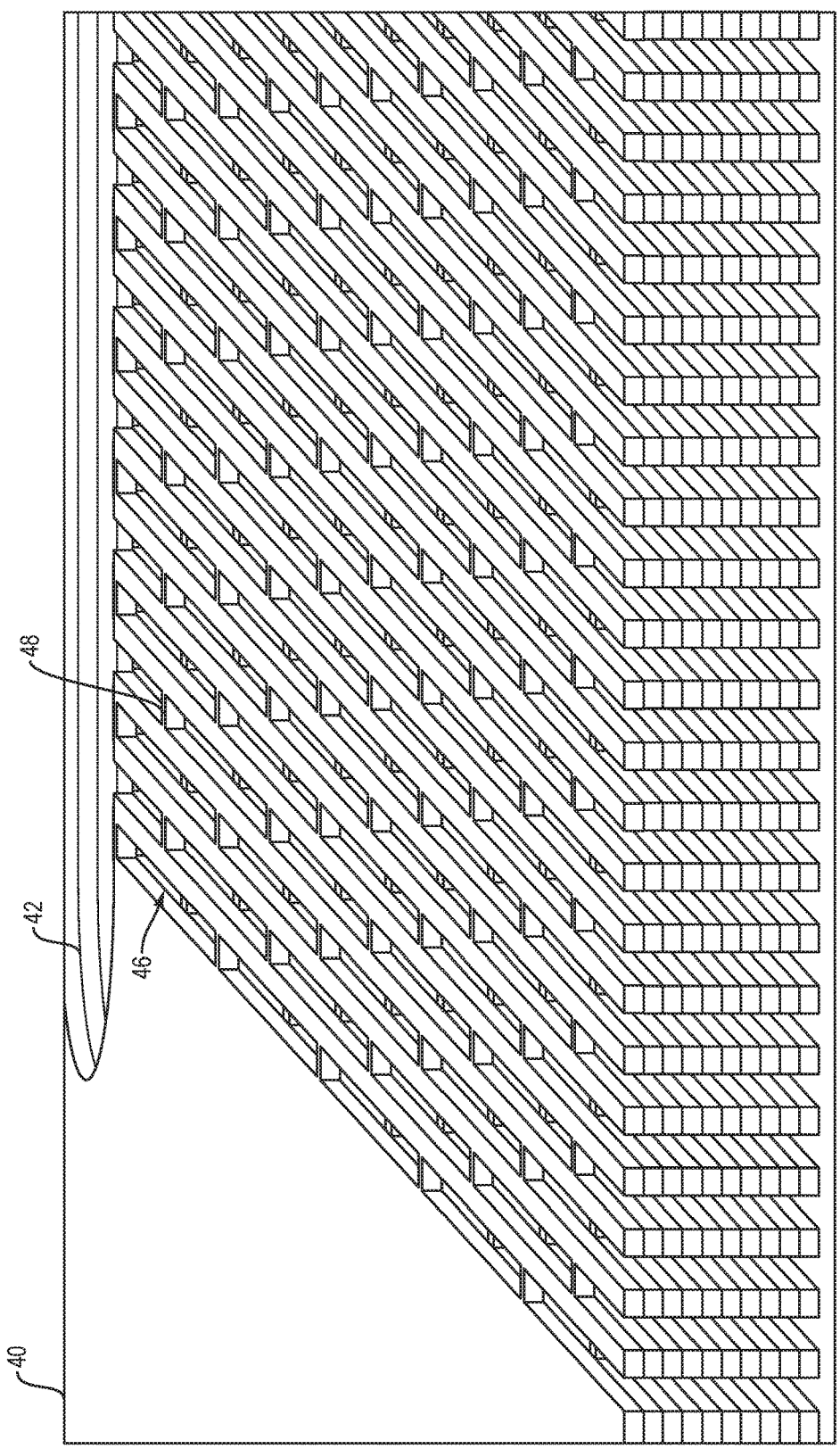
FIG. 8 is a perspective cutaway of the laminate structure formed by alternating first and second sheet types as shown FIGS. 4-7 in an orientation shown by arrow 8 in FIGS. 5 and 6.
Figure 9:
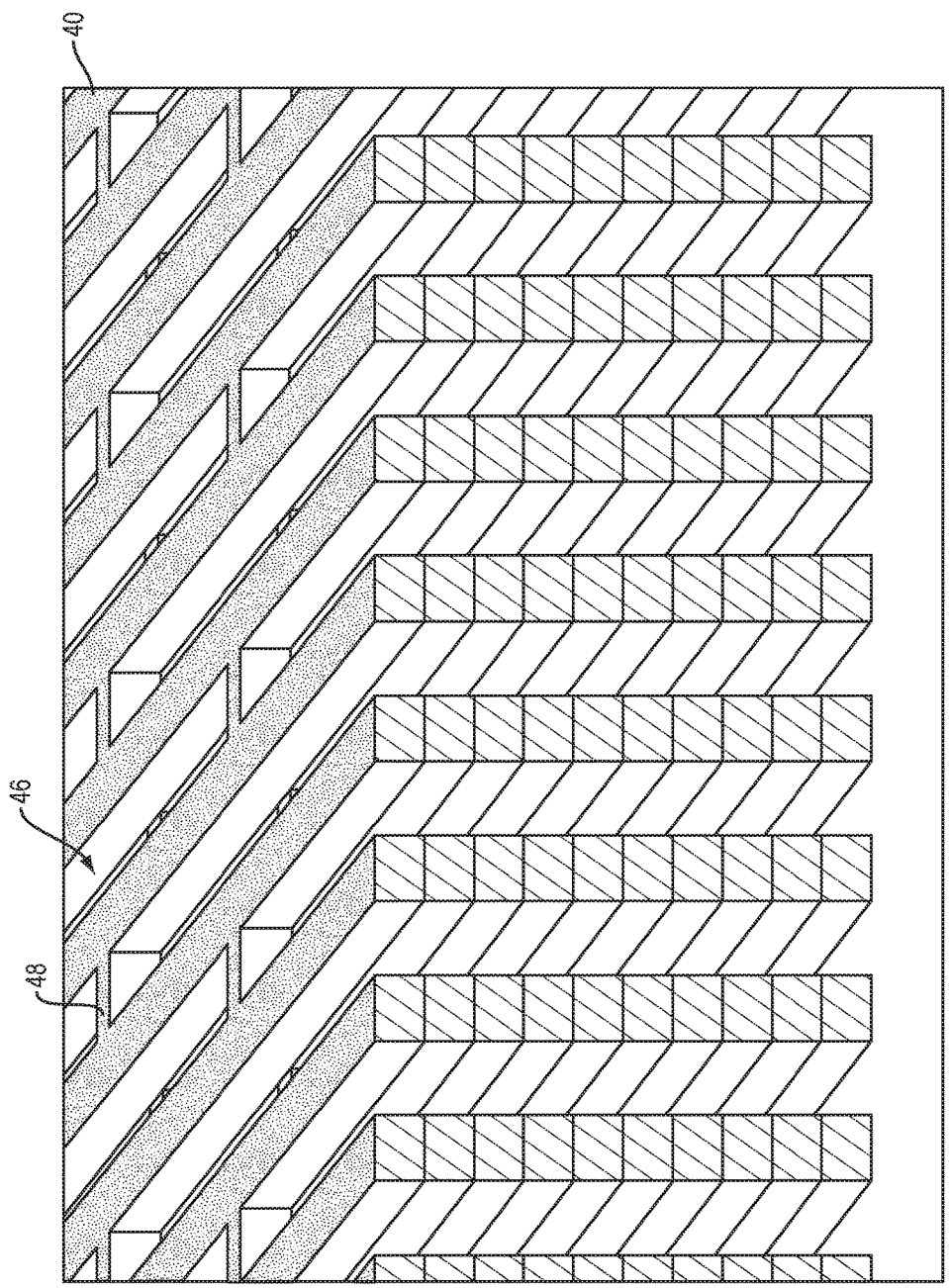
FIG. 9 is a more detailed cutaway view of the grooved laminate structure of FIG. 8.
Figure 10:
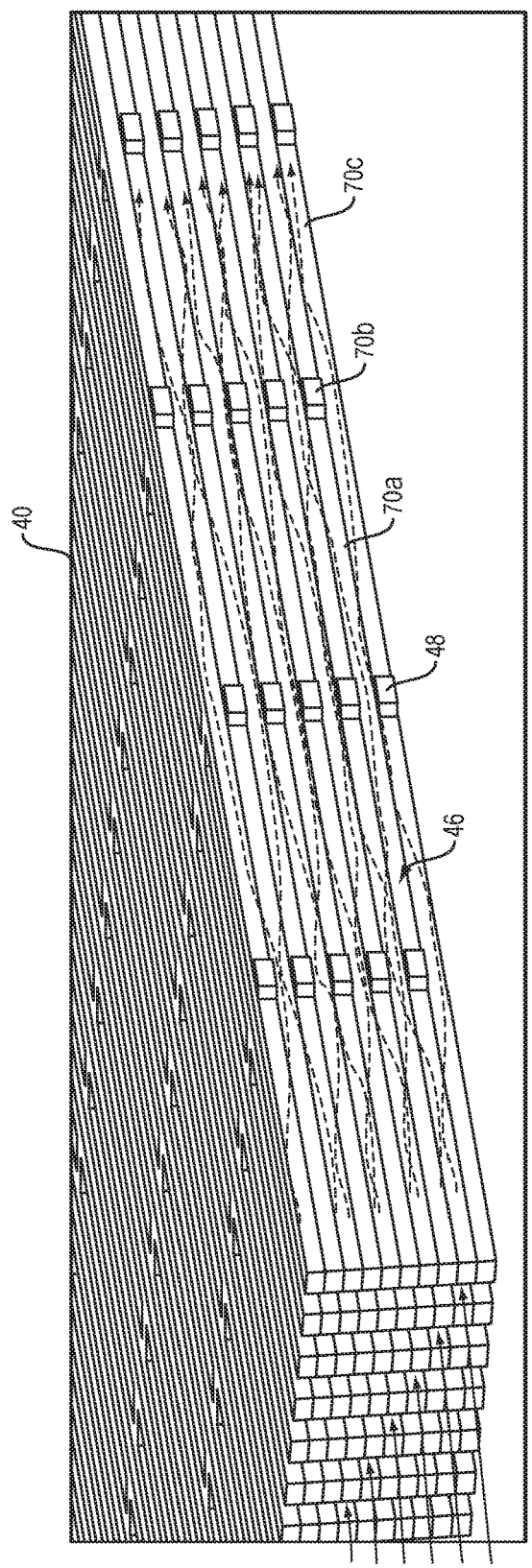
FIG. 10 is a second perspective cutaway of the laminate structure of FIG. 8 showing flow paths through the structure of FIG. 8 in an orientation shown by arrow 10 in FIGS. 5 and 6.

Referring also to FIGS. 5 and 6, alternating two or more types of sheets allows the microchannels to be defined in three-dimensions. In particular, the laminated core structure is assembled by alternating slotted-and-ribbed sheets having the cross-ribs staggered with respect to each other when the sheets are stacked so that each line of slots forms a continuous but serpentine flow path (see also FIGS. 8-10).

Figure 7:
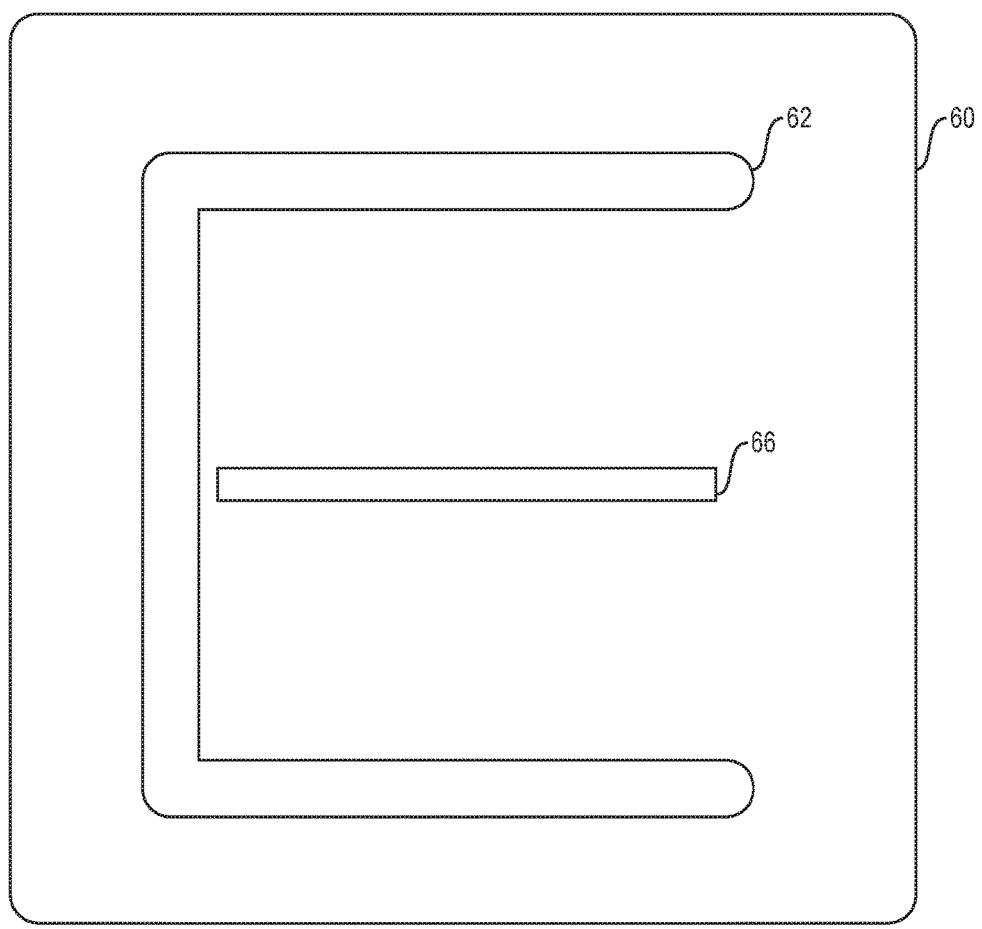
FIG. 7 is a plan view of a separator sheet for inclusion in the grooved laminate structure.

Referring to FIG. 7, thermally conductive un-slotted separator sheets 60 having cut-out areas 62 that align with the common cut-out areas of the slotted-and-ribbed sheets can also be used on the top and bottom of the core and/or to separate layers of microchannels. These sheets also include a central cut-out area 66 that serves as the outlet manifold for the microchannels and aligns with the output conduit of the evaporator; the flows from the microchannels beneath the central cut-out area are effectively divided into two, converging in and rising though the central cut-out.

Figure 11:
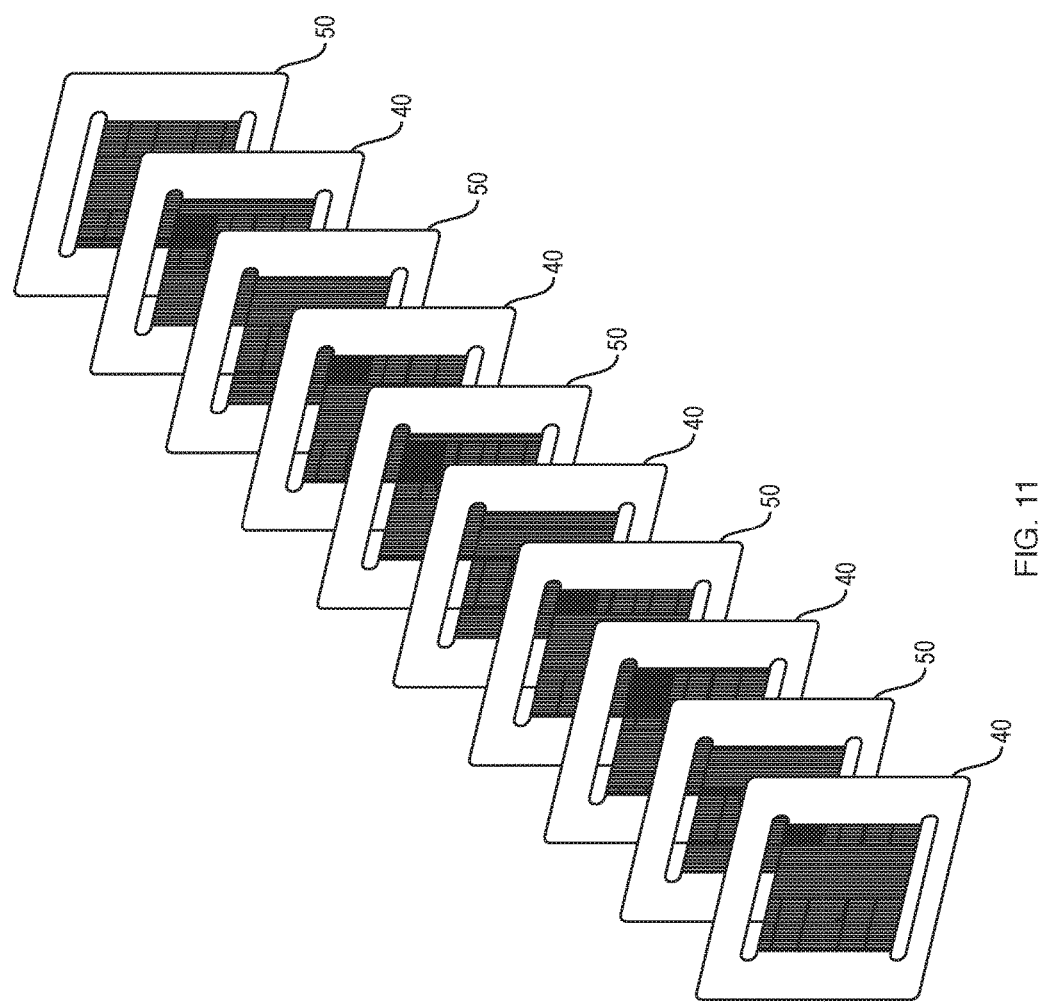
FIG. 11 is an exploded view of the laminated sheets for assembly into a grooved laminate core using the grooved laminated structure presented in FIGS. 4-10.

Referring to FIG. 11, stacking sets of the alternating slotted-and-ribbed-sheets, flanked by un-slotted separator sheets allows the formation of a core structure that includes one or more layers each having a plurality of microchannels with interspersed cross-ribs that intermittently partially interrupt the flow path with providing lateral strengthening of the channel walls. The number of alternating slotted-and-ribbed-sheets in each layer, along with the sheet thickness and slot width, determines the channel depth:width aspect ratio of the channel layers. The layered stacked sheets are preferably bonded to ensure that all the sheets are in thermally conductive communication with each other.

Figure 12:
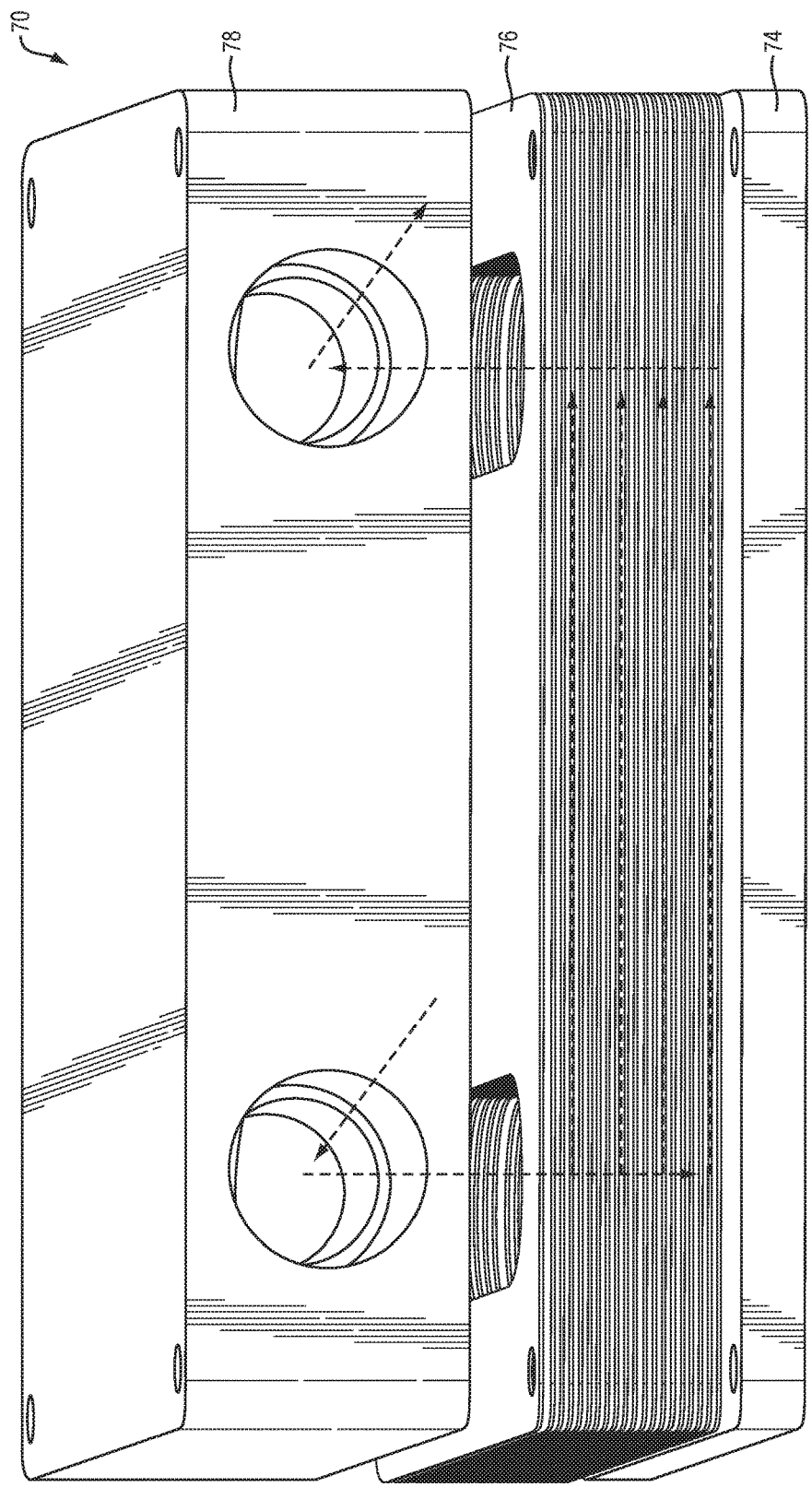
FIG. 12 is an exploded perspective view of an implementation of the converging split-flow microchannel evaporator of FIG. 1 using the laminated core of FIG. 11.

Referring to FIG. 12, the resulting sub-assembly can then be bonded to a base plate 74 to ensure that the base plate is in thermally conductive communication with the microchannel layers, and a cover 78 can be placed and sealed on top of the resulting assembly of microchannel layers 76 bonded to the base plate, thereby forming a complete microchannel heat exchanger assembly 70.

Figure 13:
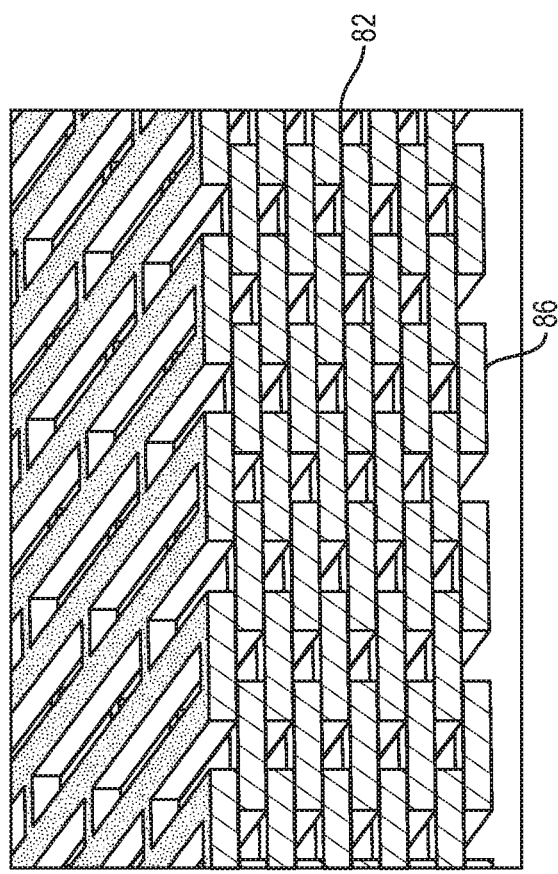
FIG. 13 is a cross-sectional view of the grooved laminate structure of FIG. 8, taken through a plane that defines flow restrictors in the grooved laminate structure.

Referring to FIG. 13, the input sides of the microchannels preferably include flow restrictors. These can be built into the laminate structure by providing extra cross-ribs 82 at the inputs of the microchannels.

The laminated structures described above enable microchannel heat exchangers having one or more layers of microchannels with hydraulic diameters of less than 500 microns, with the microchannels having arbitrarily high depth:width aspect ratios and with thin walls. The channels have internal cross-ribs connecting the channel's walls, and provide mechanical strength to the channel walls and way of breaking up the fluid stream lines to improve heat transfer. The thermally conductive sheet and base plate materials are preferably, but not limited to, metals and their alloys; non-metallic elements, thermally conductive carbon allotropes, or thermally conductive ceramics. Bonding of the sheets can be by any convenient means that ensure high thermal conduction between the sheets and the base plate.

Multiple layers of microchannels are formed by inserting, between stacks of slotted-and-ribbed sheets, additional thermally conductive un-slotted separator sheets having cut-out areas that align with the common cut-out areas of the slotted-and-ribbed sheets. The microchannels of any layer the may have the same or different depth: width aspect ratio and hydraulic diameter compared to the microchannels in the other layers.

The depth:width aspect ratio of the resulting microchannels can be at least 2:1, and preferably between 4:1 and 15:1. The walls between the resulting microchannels can be less than 200 microns and preferably between 40 and 100 microns thick. The base plate and microchannel walls can be fabricated from materials having thermal conductivities in excess of 100 W/m-K. The hydraulic diameter of the resulting microchannels can be less than 500 microns, and preferably between 50 and 200 microns.

The liquid inlet channels can be provided with flow restrictors, to prevent back-flow or two-phase flow instabilities. These inlet restrictions are provided by closing-off the inlet-side ends of the slots (e.g. by adding additional cross-ribs) of alternate sheets in the stacks of slotted-and-ribbed sheets, thereby reducing the open cross-sectional area of the inlets to the channels relative to the main channel cross-section beyond the closed portions. Preferably, the length of the closed-off (restriction) portions of the microchannels is at least 1 mm.

The various components of the microchannel heat exchanger (e.g. microchannel stacks, base plate, and over plate) can be bonded or fused, so that the exchanger is hermetically sealed (with the exception of the fluid inlet and outlet ports that communicate with the manifolds), so that the exchanger can hold elevated internal pressures. Bonding or fusing may be accomplished by any convenient means.

The various components of the microchannel heat exchanger (e.g. microchannel stacks, base plate, and over plate) can also be held together by mechanical means, with suitable seals between components, so that the exchanger can hold elevated internal pressures.

In another embodiment, the bottom base of the layer of the microchannel exchanger is made from or is coated with a thermally conductive yet electrically insulating ceramic or dielectric solid, such as aluminum nitride, silicon carbide, beryllium oxide, diamond film, and the like. The microchannel exchanger then serves as the substrate for (heat generating) electronic components, which are mounted on, and in thermal contact with, the electrically insulating but thermally conductive underside surface of the exchanger.

Methods of Manufacture

The various components of the microchannel evaporator, e.g. the thermally conductive base, the microchannel layers, manifolds, covers, fluid inlet and outlet ports, the slotted-and-ribbed sheets, etc. may be fabricated by any convenient means consistent with the final assembly of the evaporators. Such means may include, but are not limited to, the following methods and combinations thereof:

- Subtractive manufacturing techniques such as mechanical machining, milling, etching, punching, photochemical machining, laser ablation or micromachining, electrical discharge machining (EDM), ultrasonic machining, water-jet cutting, etc.
- Mechanical deformation of material, e.g. by skiving, "plowing", stamping, coining, extrusion, etc.
- Laminating and bonding of patterned sheets, to form 3-dimensional structures with internal features and passages. The sheets may have repeating areas of the patterns, so that after bonding, the bonded assemblies may be cut or diced into individual microchannel exchangers or exchanger sub-assemblies.
- Additive manufacturing techniques (3-D printing) as selective laser sintering, direct metal laser sintering, selective laser melting, stereo-lithography, fused deposition modeling, etc.
- Bonding or fusing techniques such diffusion bonding, brazing, soldering, welding, sintering, etc.
- Mechanical assembly techniques such as bolts, studs, clamps, adhesives, and the like, using seals, as appropriate, such as gaskets, O-rings, caulks, etc.

Multi-Part and Non-Parallel Embodiments

Figure 14A:
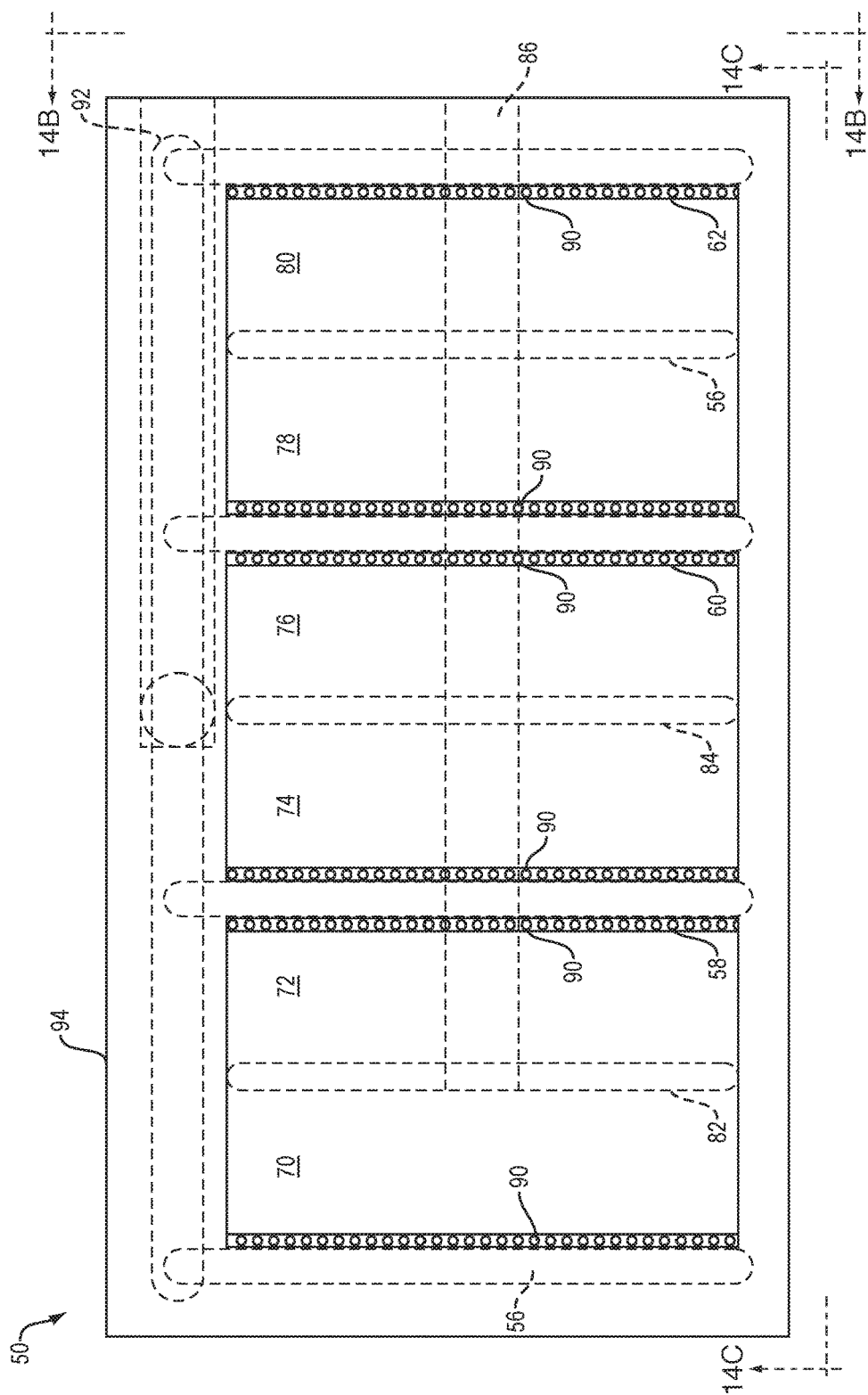
FIG. 14A is a first view of a three-view drawing of a multi-part converging split-flow microchannel evaporator according to the invention.
Figure 14B:
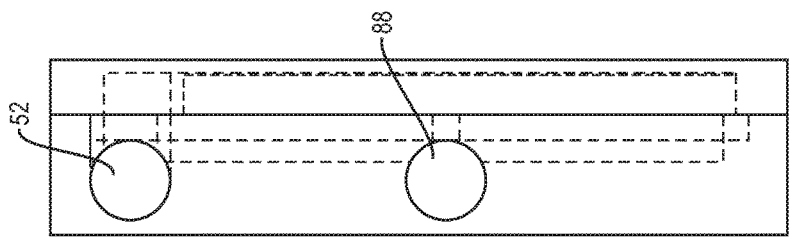
FIG. 14B is a second view of a three-view drawing of a multi-part converging split-flow microchannel evaporator according to the invention.
Figure 14C:
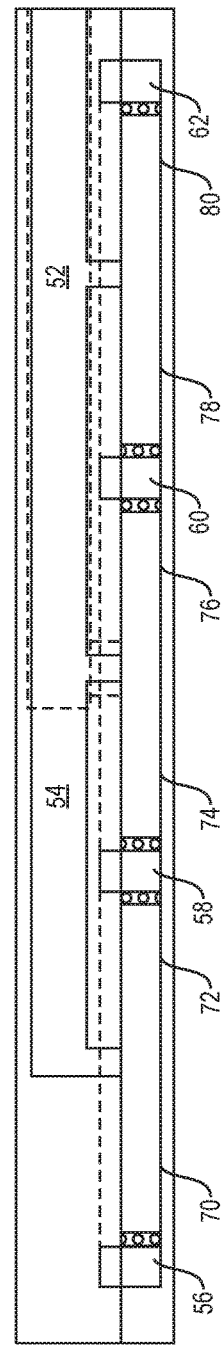
FIG. 14C is a third view of a three-view drawing of a multi-part converging split-flow microchannel evaporator according to the invention.
Figure 15:
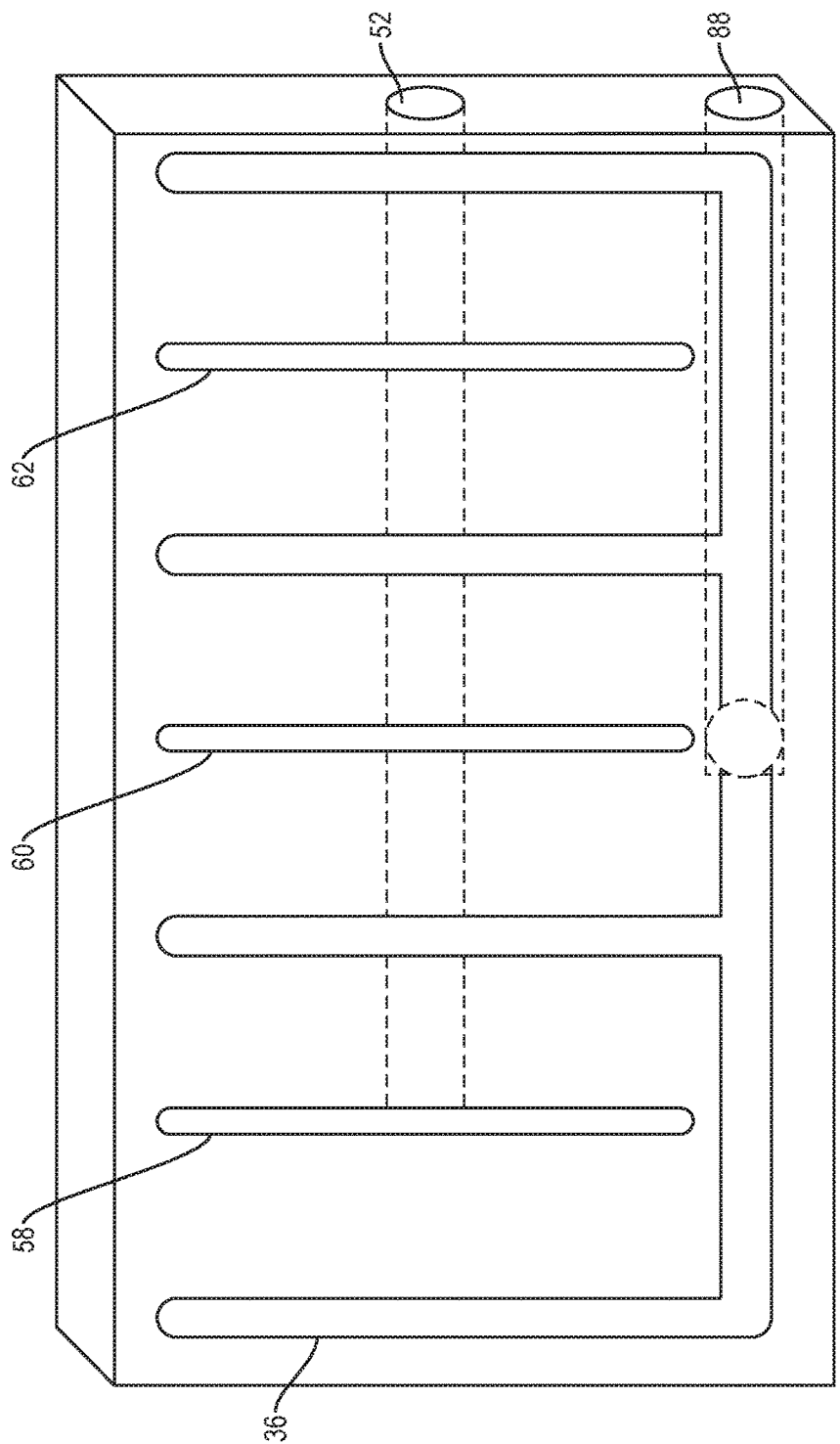
FIG. 15 is a three-dimensional diagram of the multi-part converging split-flow microchannel evaporator of FIG. 13 showing fluid paths to and from the microchannels.

Referring to FIGS. 14 and 15, a multi-part converging split-flow microchannel evaporator, such as a three-part evaporator 50 can also be built. This type of structure includes three evaporators that are fed in parallel, although they can also operate in series. An inlet conduit 54 receives fluid from an inlet opening 52 and conveys it to four manifolds 56, 58, 60, 62 that feed both sides 70, 72, 74, 76, 78, 80 of each of three banks of microchannels in each of the evaporators. Advantageously, only a single common manifold needs to be provided between adjacent evaporators. An output conduit network 86 channels the fluid from the center of each of the three banks of microchannels to an outlet 88. Flow restrictors 90 are also provided between the manifolds and the microchannels. Separate single-part and multi-part flow restrictors can also be connected in parallel or in series through intermediate conduits.

Figure 16:
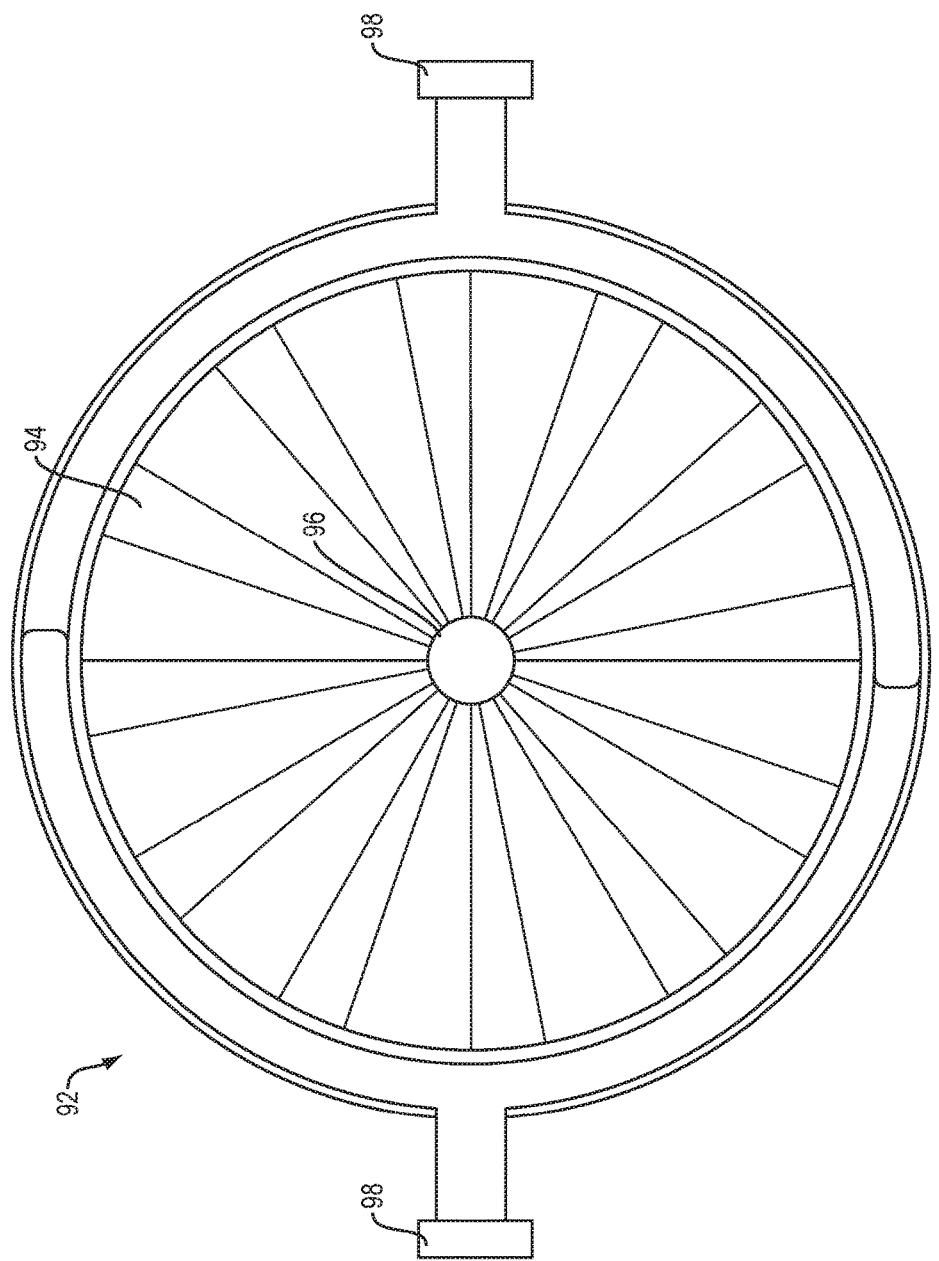
FIG. 16 is a schematic diagram showing a radial converging split-flow microchannel evaporator according to the invention.

Referring to FIG. 16, non-parallel exchangers are also possible. A radial exchanger 92 can be built to cool a round component, for example. This type of exchanger includes microchannels 94 extending radially from semicircular common cut-out areas inward toward a centrally located output channel 96. Other geometries are also possible.

Check valves 98 can also be provided upstream of the inlets to help ensure ready startup without reverse flow. These can be of any suitable type and can be deployed on any of the embodiments described in this document. In one embodiment, the check valves can include a Tesla diode.

Embodiments according to the invention can be developed for a variety of different cooling configurations and applied to a variety of different cooling tasks. For example, they can be implemented in connection with the teachings of published PCT application no. WO2009/085307, filed Dec. 26, 2008 and published US application no. US-2009-0229794, filed on Nov. 10, 2008, which are both herein incorporated by reference.

The present invention has now been described in connection with a number of specific embodiments thereof. However, numerous modifications which are contemplated as falling within the scope of the present invention should now be apparent to those skilled in the art. Therefore, it is intended that the scope of the present invention be limited only by the scope of the claims appended hereto. In addition, the order of presentation of the claims should not be construed to limit the scope of any particular term in the claims.

What is claimed is:

1. A converging split-flow microchannel evaporator, comprising:
   a thermally conductive contact surface to mate to a surface to be cooled,
   a core mounted in thermal connection with the contact surface and defining at least one layer of microchannels each spanning between a first end and a second end,
   a first fluid inlet hydraulically connected to the first end of a first plurality of the microchannels defined in the core,
   a first plurality of inlet restrictions at the first fluid inlet that each restrict the flow into one of the first plurality of microchannels defined in the core,
   a second fluid inlet hydraulically connected to the first end of a second plurality of the microchannels defined in the core,
   a second plurality of inlet restrictions at the second fluid inlet that each restrict the flow into one of the second plurality of microchannels defined in the core, and
   a fluid outlet located between the first fluid inlet and the second fluid inlet, hydraulically connected to the second ends of the microchannels in the first plurality of microchannels, and hydraulically connected to the second ends of the microchannels in the second plurality of microchannels.

2. The apparatus of claim 1 wherein the first plurality of microchannels are oriented in parallel between the first fluid inlet and the fluid outlet and wherein the second plurality of microchannels are oriented in parallel between the second fluid inlet and the fluid outlet.

3. The apparatus of claim 2 further including:
   a third fluid inlet hydraulically connected to the first end of a third plurality of microchannels defined in the core,
   a third plurality of inlet restrictions at the third fluid inlet that each restrict the flow into one of the third plurality of microchannels defined in the core,
   a fourth plurality of inlet restrictions that each restrict the flow into one of a fourth plurality of microchannels defined in the core, and
   a second fluid outlet located between the third fluid inlet and the second fluid inlet, wherein the fluid outlet is hydraulically connected to the second ends of the microchannels in the third plurality of microchannels defined in the core, and hydraulically connected to the second ends of the microchannels in the fourth plurality of microchannels defined in the core.

4. The apparatus of claim 3 wherein the second fluid inlet is hydraulically connected to the first end of the third and fourth pluralities of microchannels defined in the core.

5. The apparatus of claim 1 wherein the microchannels are organized in a radially converging pattern around the fluid outlet.

6. The apparatus of claim 1 wherein the core defines multiple layers of microchannels at different distances from the thermally conductive contact surface.

7. The apparatus of claim 1 wherein at least some of the microchannels have different cross-sections.

8. The apparatus of claim 1 wherein the microchannels defined by the core each has a hydraulic diameter of less than 1000 microns.

9. The apparatus of claim 1 wherein the first and second inlet restrictions are defined by a cross-sectional area of restriction that is no more than about three-quarter the cross sectional area of the largest section of the remainder of the length of the microchannels, and the length of the flow restriction is less than 20% of the remainder of the length of the microchannels.

10. The apparatus of claim 1 wherein the hydraulic diameter of the microchannels is less than 500 microns.

11. The apparatus of claim 1 further including a check valve upstream of the first and second inlets to help ensure ready startup without reverse flow.

12. The method of claim 11 wherein the check valve includes a Tesla diode.

13. The apparatus of claim 1 wherein the first and second inlet restrictors include check valves.

14. The apparatus of claim 1 wherein the thermally conductive contact surface is part of a base plate and wherein the core is mounted on the base plate opposite the thermally conductive contact surface.

15. A method of evaporatively cooling a surface, comprising:

contacting the surface with an evaporator, causing a liquid coolant to flow separately into at least two different flows in the evaporator, conveying a first of the different flows of the liquid coolant into a first plurality of separate microchannels in the evaporator, restricting the first flow of the liquid coolant into each of the first plurality of separate microchannels in the evaporator, conveying a second of the different flows of the liquid coolant into a second plurality of separate microchannels in the evaporator, restricting the second flow of the liquid coolant into each of the second plurality of separate microchannels in the evaporator, evaporating at least some of the liquid coolant in the first and second pluralities of microchannels, and reuniting the flows after the step of evaporating.

16. The method of claim 15 wherein the step of causing a coolant to flow is completely passive.

17. The method of claim 15 wherein the step of causing a coolant to flow includes a step of wicking.

18. The method of claim 15 wherein the step of causing a coolant to flow is part of a thermosiphon process.

19. The method of claim 15 wherein the step of causing a coolant to flow includes a step of pumping.

20. The method of claim 15 wherein the step of causing a coolant to flow causes a refrigerant to flow.

21. The method of claim 15 wherein the step of causing a coolant to flow causes a dielectric fluid to flow.

* * * * *